US011052599B2

(12) United States Patent
Savla

(10) Patent No.: US 11,052,599 B2
(45) Date of Patent: Jul. 6, 2021

(54) STEREOLITHOGRAPHY WITH THERMOPLASTIC PHOTOPOLYMERS

(71) Applicant: Manilal J. Savla, Manalapan, NJ (US)

(72) Inventor: Manilal J. Savla, Manalapan, NJ (US)

(*) Notice: Subject to any disclaimer, the term of this patent is extended or adjusted under 35 U.S.C. 154(b) by 0 days.

(21) Appl. No.: 17/092,105

(22) Filed: Nov. 6, 2020

(65) Prior Publication Data

US 2021/0138723 A1 May 13, 2021

Related U.S. Application Data

(60) Provisional application No. 62/932,251, filed on Nov. 7, 2019.

(51) Int. Cl.
| | |
|---|---|
| *B29C 64/147* | (2017.01) |
| *B29C 64/264* | (2017.01) |
| *G03F 7/20* | (2006.01) |
| *G03F 7/00* | (2006.01) |
| *B29K 101/12* | (2006.01) |

(52) U.S. Cl.
CPC ......... *B29C 64/147* (2017.08); *B29C 64/264* (2017.08); *G03F 7/0037* (2013.01); *G03F 7/70416* (2013.01); *B29K 2101/12* (2013.01)

(58) Field of Classification Search
CPC .................................................. B29C 64/147
See application file for complete search history.

(56) References Cited

U.S. PATENT DOCUMENTS

| | | | |
|---|---|---|---|
| 2003/0180655 A1* | 9/2003 | Fan | G03F 7/202 430/270.1 |
| 2007/0218409 A1* | 9/2007 | McLean | G03F 7/092 430/302 |
| 2011/0039211 A1* | 2/2011 | Hannum | G03F 7/202 430/306 |
| 2019/0263054 A1* | 8/2019 | Kotler | B29C 64/218 |

* cited by examiner

*Primary Examiner* — Joseph S Del Sole
*Assistant Examiner* — Margaret B Hayes

(57) ABSTRACT

Stereolithography using solid thermoplastic photopolymer plates/sheets/films provides a new technique to make 3D printed objects. In this new additive manufacturing process, objects are built layer-wise using thermoplastic photopolymers and actinic radiation. The thermoplastic photopolymer compositions consist of a thermoplastic photopolymer layer sandwiched between a transparent flexible base without an anchoring layer and a release film. Un-crosslinked portions of the 3D printed object are removed by heat. Preferred method of radiation exposure is digital light processing (DLP)

4 Claims, 1 Drawing Sheet

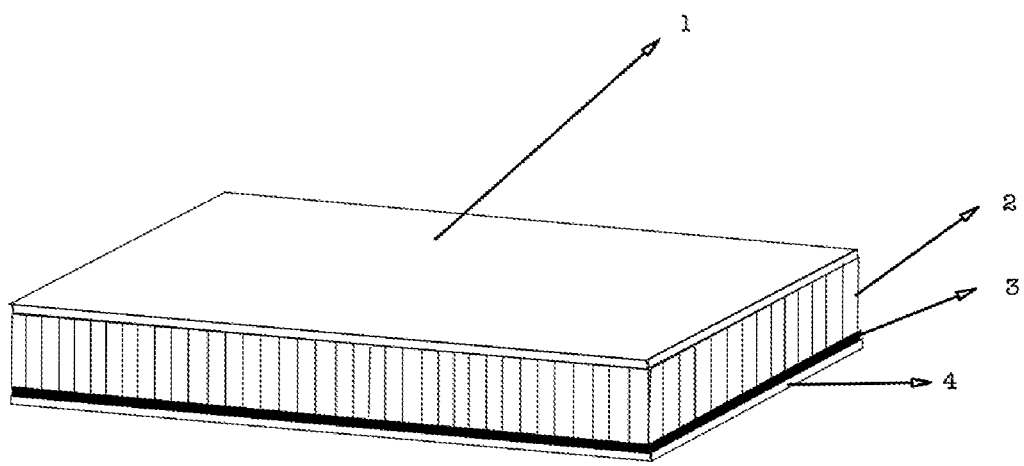

STEREOLITHOGRAPHY WITH THERMOPLASTIC PHOTOPOLYMERS

CROSS-REFERENCE TO RELATED APPLICATIONS

Provisional Patent Application No. 62/932,251 dated Nov. 7, 2019

FIELD OF THE INVENTION

The present invention generally relates to the use of dry photopolymers in the form of thermoplastic sheets/plates/films, manufacturing apparatus, methods of manufacture, and products manufactured thereby and, more particularly, to a 3D printed object formed from individually and selectively exposed dry photopolymer layers of the same or gradually varying shape.

PRIOR ART

In U.S. Pat. No. 4,575,330, entitled "Apparatus for Production of Three-Dimensional Objects by Stereolithography" the inventor claims a system of producing a three-dimensional object by successively solidifying thin layers of fluidic UV-curable material, one on top of the other. Stereolithography (SL) is one of the most widely used 3D printing technologies known in the art. SL uses liquid photopolymers for making 3D objects. The SL process requires support structures to hold each cross-section in place while building the object layer by layer.

U.S. Pat. No. 4,752,498 describes a process whereby an entire surface of a liquid photopolymer is irradiated through a photomask and liquid photopolymer being in contact with a proprietary plastic film for easy release subsequently.

U.S. Pat. No. 5,014,207 also uses liquid photopolymer and calls its process solid imaging system. However, it is similar to the SL process discussed above.

In U.S. Pat. No. 5,192,559, authors use dry film photoresists to build a 3D object. However, the process does not use DLP technology or thermoplastic photopolymers. Development is done with solvents or aqueous liquids and not heat.

U.S. Pat. No. 5,247,180 discloses use of deformable mirror device to reflect radiation on surface of liquid photopolymer.

In U.S. Pat. No. 5,263,130, authors describe a process wherein liquid photopolymer is selectively solidified layer by layer, the non-solidified portions thereof are removed and replaced by a removable support material such as wax which is not solidifiable under the same conditions as the solidifiable material. Here, wax acts a support structure.

In U.S. Pat. No 5,637,175, authors describe a method called laminated object manufacturing (LOM) relying on laminations produced out of powder or sheet materials. The latter include bonded paper, plastic or metal sheet stock. No photopolymers are used.

In U.S. Pat. No 6,797,454, authors describe a process for formation of flexographic printing plate on a flexible substrate which is an integral part of the printing plate.

In U.S. Pat. No. 7,790,093, inventors use digital light processing technique to build a three-dimensional object from solidifiable liquid resin.

SUMMARY OF THE INVENTION

Conventional Stereolithography(SL) uses a liquid photopolymer resin for object building.

We define dry stereolithography as a SL process which uses thermoplastic photopolymers in sheet/plate/film form instead of liquid photopolymer resin and does not require support structures during the built process. Thermoplastic photopolymers refer to photopolymer formulations whose unexposed or un-crosslinked regions melt upon heating and molten portions are thus removable.

Accordingly, the present invention is about an apparatus and method for forming an integral three-dimensional object from thermoplastic photopolymer layers of the same or gradually varying shape. These layers are made of selectively radiation exposed dry photopolymers. Examples of dry photopolymers include dry film photoresists and unprocessed solid printing plates on an un-bonded transparent polyester support. The method comprises steps of : removing release layer of dry photopolymer leaving behind photopolymer layer on a transparent support film; hot-laminating bubble-free photopolymer layer to a build pad; selectively exposing the photopolymer layer through the transparent support layer with prescribed radiation; removing the support layer; laminating a fresh dry photopolymer layer with the support layer in registration to the previous radiation exposed layer; selectively exposing the second photopolymer layer through the support layer to same or gradually varying shape with prescribed radiation; repeating the process until the desired three dimensional object is formed in layers of stack consisting of exposed and cross-linked photopolymer in three dimensions supported by unexposed and un-crosslinked photopolymer in three dimensions and removing the un-crosslinked portion of the stack with heat leaving behind the desired three dimensional object. Alternately, successive layers may be exposed first by the radiation source separately and then laminated to the previously exposed layers on the build pad in registration.

Preferred method of radiation exposure is digital light processing (DLP). In DLP, a high-definition projector flashes an image of desired cross-section onto the surface of photopolymer with a prescribed radiation.

DETAILED DESCRIPTION

Photopolymers are imaging compositions based on polymers/oligomers/monomers which can be selectively polymerized and/or crosslinked upon image-wise exposure by light radiation such as ultra-violet light. For final use, they are made into different forms including film/sheet, liquid, solution etc. which find outlets in printing plates, photoresists, stereolithography/3D printing etc. In stereolithography/3D printing, hitherto, photopolymers in liquid form, also called resins, have been used. This invention relates to use of photopolymers in solid or dry form, U.S. Pat. No. 5,192,559, mentions use of dry film photoresists to build a 3D object. However, development is done with solvents or aqueous liquids and not heat. Whereas, this invention uses dry photopolymers which are thermoplastic and they melt upon heating.

This invention uses dry photopolymers in the form of thermoplastic sheets/plates/films, as a sandwich of a photosensitive polymer layer between a release film and a supporting transparent film. The photopolymer composition is of thermoplastic type, meaning, unexposed photopolymer melts upon heating. The release film may be typically polyethylene and the supporting film may be typically a polyester film. Examples of such photopolymers include dry film photoresists and solid printing plates made of thermoplastic compositions on a transparent polyester support without an anchoring layer.

In conventional stereolithography (SL), the first stage involves designing and inputting a precise mathematical and geometric description of the desired structure's shape into one of many computer-aided design (CAD) programs and saving the description in the standard transform language (STL) file format. In the second stage, the STL file is imported into SL machine-specific software which slices the design into layers and determines the placement of support to hold each cross-section in place while building the structure layer by layer. Finally, the machine language controls the SL machine to build a desired part and its support structures layer by layer. SL machines typically focus an ultraviolet (UV) laser onto a cross-section of a liquid photopolymer resin. The laser, in turn, selectively cures a resin to form a structure, layer by layer. Ultimately, the part is cleaned, the support structure is removed and the part is post-cured (typically exposed to UV) prior to completion.

FIG. 1 shows a typical structure of a commercial photopolymer printing plate having an anchoring layer 3. The top protective release film 1 sits on the photopolymer layer 2 which is anchored (bonded) to the transparent support film 4.

The present invention is about an apparatus and method for forming an integral three-dimensional object from laminations of the same or gradually varying shape made of selectively radiation exposed dry photopolymer layers. The apparatus includes a station for storing and supplying a dry photopolymer plate/sheet/film with means for forming the material into a plurality of individually radiation exposed laminations in shapes required for assembly in a preselected sequence into the three-dimensional object. It also includes means for removal of release film and support layer and means for integrally bonding each layer.

Individual layers may be exposed via a laser spot scanning or through a photomask using area exposure technique but preferably digital light processing (DLP) technology to obviate the need of a photomask, wherein, DLP projector connected with a computer directly exposes each layer of photopolymer selectively.

A dry photopolymer form for this invention consists of three layers: 1) a release layer of polyolefin film 2) a photopolymer layer and 3) a support layer of a transparent polyester or similar film. Thickness of the photopolymer layer can range from 15 microns and above depending upon final finish desired in the 3D printed object. Hardness of cured dry photopolymer can range from Shore A hardness of 25 for a rubbery polymer to Shore D hardness of 95 of a hard plastic. In a typical process, the dry photopolymer plate/sheet/film is cut into a size little larger than the largest cross-section of the object to be printed. The release layer is removed and the photopolymer side layer is laminated to a platform or a build pad with a heated roller or a platen. It is then selectively exposed through the transparent polyester layer with UV radiation for, say, 20 to 30 seconds. During exposure, the polyester film prevents oxygen in the air to inhibit photopolymerization. After exposure, the polyester layer is removed and a new photopolymer layer with support polyester layer is laminated to the exposed layer. The process is repeated. The radiation exposed areas of photopolymer get partially crosslinked, whereas, the unexposed areas remain thermoplastic. The unexposed areas act as a support to the formed object. Alternately, successive layers are exposed first by the radiation source separately and then laminated to the previously exposed layers on the build pad in registration.

Upon completion of the process, entire assembly is removed from the platform and placed in a melting unit to melt-away, at a temperature of more than 150 degree C., unexposed and un-crosslinked portion leaving behind the intended three dimensional object. Aqueous or solvent washout may be necessary to remove any un-crosslinked residue left on the object after the melt out. The final object may be cured under UV light or thermal conditions to achieve full strength.

The photopolymers are typically negative acting, wherein, radiation-exposed areas become non-thermoplastic as a result of crosslinking or photopolymerization.

A photopolymer supply station with a feeding mechanism with means for removing the polyolefin release film, a registration mechanism, pre- or post hot lamination mechanism, a computer-assisted exposure system and a mechanism to remove the polyester support film may be built into the same apparatus. Exposure has to be done under safe light conditions as photopolymer layer is sensitive to visible and UV lights. A separate station to melt away unexposed polymer from the 3D object and clean it may be required.

Dry photopolymer plates/sheets/films are environmentally friendly and hence a 3D printer using dry photopolymer material would be specifically suitable for schools, homes and small offices. A 3D printer for dry stereolithography should be useful in markets such as footwear, jewelry, dentistry, hearing aid and similar objects.

COMPARATIVE EXAMPLE

Examples of commercial thermoplastic photopolymer printing plates include DuPont's Cyrel Fast FDT and Flint's nyloflex XFH. After exposure, unexposed photopolymer in these plates is melted away and absorbed in a special absorbent nonwoven web in a separate unit. Thermoplastic photopolymer compositions used in these thermal plates are well known in the art. They are generally based on styrene-isoprene-styrene and styrene-butadiene-styrene thermoplastic elastomers compounded with acrylic crosslinkers and photosensitizers. Other thermoplastic polymer bases are possible. Thermoplasticity is measured in terms of Melt Flow Index (MFI). These thermoplastic photopolymers should have a MFI of at least 4 grams/10 min. under a 2.16 kilogram weight at 140.degree. C., most preferably, greater than 10 grams/10 minutes at 140.degree. C.

However, the commercial photopolymer printing plates have a photopolymer layer integrally bonded to a flexible polyester film and hence may not be suitable for use in this invention. This bonded film is not easy to remove from the attached photopolymer layer.

In absence of availability of a commercial thermoplastic photopolymer plate without an anchoring layer on a polyester substrate, a commercial dry film photoresist, a photomask and UV light were used to build an object by dry stereolithography. In dry film photoresists, the polyester substrate is generally not anchored to the photopolymer layer. The photoresist used did not have truly thermoplastic photopolymer layer but a person skilled in the art has in-principle knowledge of formulating thermoplastic compositions suitable for thermal development such as those used in thermally developed printing plates as disclosed previously.

The invention claimed is:

1. A method of converting photosensitive layers of dry and solid thermoplastic photopolymer film into a three dimensional object, comprising:

a. obtaining a first dry thermoplastic photopolymer film comprising:
   i. a removable release layer,
   ii. a first dry thermoplastic photopolymer layer, and
   iii. a first transparent support layer;
b. then, removing the removable release layer from the first dry thermoplastic photopolymer layer and leaving behind the first dry thermoplastic photopolymer layer and the first transparent support layer;
c. hot-laminating the first dry thermoplastic photopolymer layer to a build pad such that the lamination results in a first photopolymer film comprising:
   iv. the build pad,
   v. the first dry thermoplastic photopolymer layer, and
   vi. the first transparent support layer;
d. selectively exposing the first dry thermoplastic photopolymer layer through the first transparent support layer with digital light processing (DLP) for 20 to 30 seconds, thereby creating a cured portion of the first dry thermoplastic photopolymer layer,
e. removing the first transparent support layer from the first dry thermoplastic photopolymer layer,
g. hot-laminating a second dry photopolymer film, comprising:
   vii. a second dry thermoplastic photopolymer layer and
   viii. a second transparent support layer to the first dry thermoplastic photopolymer layer with the cured portion, thereby creating a stack comprising:
   ix. the build pad,
   x. the first dry photopolymer layer with the cured portion,
   xi. a second dry thermoplastic photopolymer layer, and
   xii. a second transparent support layer;
h. selectively exposing the second dry photopolymer layer through the second transparent support layer with digital light processing (DLP) for 20 to 30 seconds, thereby creating an external dry thermoplastic photopolymer layer with a cured portion;
i. removing the second transparent support layer from the external dry thermoplastic photopolymer layer;
j. repeating the process of hot-laminating a subsequent dry photopolymer film to the external dry thermoplastic photopolymer layer, selectively exposing the subsequent dry photopolymer layer through the subsequent transparent support layer with digital light processing (DLP) for 20 to 30 seconds, and removing the subsequent transparent support layer until the cured portions of the stack forms a three-dimensional object with unexposed, uncured, and dry thermoplastic photopolymer portions,
l. submitting the three-dimensional object with unexposed, uncured, and dry thermoplastic photopolymer portions to final processing by melting the unexposed, uncured, and dry thermoplastic photopolymer layers, thereby producing the three-dimensional object with an unexposed, uncured, and dry thermoplastic photopolymer residue; and
m. then, treating the three-dimensional object with aqueous or solvent wash-out to remove the unexposed, uncured, and dry thermoplastic photopolymer residue; and
n. treating the three-dimensional object with UV-light, heating, or cooling to harden the three-dimensional object.

2. The method of claim 1, wherein selectively exposing the first, second, or subsequent dry thermoplastic photopolymer layer occurs prior to hot-laminating the first, second, or subsequent dry thermoplastic photopolymer layer.

3. The method of claim 1, wherein the first, second, and subsequent dry thermoplastic photopolymer film comprises:
   o. the first, second, or subsequent transparent support layer and
   p. the first, second, or subsequent transparent thermoplastic photopolymer layer are coupled without an anchoring or adhesive layer between them.

4. The method of claim 1, wherein the first, second, or subsequent dry thermoplastic photopolymer layers have an MFI of at least 10 grams/10 minutes at 140° C.

* * * * *